(12) United States Patent
Wu

(10) Patent No.: US 6,522,534 B1
(45) Date of Patent: Feb. 18, 2003

(54) PEN-TYPE PORTABLE MEMORY DEVICE

(75) Inventor: Kuei-Turng Wu, Taipei (TW)

(73) Assignee: Speed Tech Corp., Taoyuan (TW)

( * ) Notice: Subject to any disclaimer, the term of this patent is extended or adjusted under 35 U.S.C. 154(b) by 0 days.

(21) Appl. No.: 09/968,865

(22) Filed: Oct. 3, 2001

(51) Int. Cl.[7] .................................................. G06F 1/16
(52) U.S. Cl. .................... 361/686; 361/707; 360/97.01; 312/223.2
(58) Field of Search ................................. 361/686, 687, 361/683, 704, 707, 724–727; 360/97.01, 98.01; 364/708.1; 312/223.1–223.6

(56) References Cited

U.S. PATENT DOCUMENTS

| | | | |
|---|---|---|---|
| 5,820,551 A | * 10/1998 | Hill et al. | 600/347 |
| 5,925,021 A | * 7/1999 | Castellano et al. | 604/207 |
| 6,119,944 A | * 9/2000 | Mulla et al. | 235/472.03 |
| 6,497,914 | * 6/2002 | Helot | 361/686 |

* cited by examiner

Primary Examiner—Darren Schuberg
Assistant Examiner—Hung Van Duong
(74) Attorney, Agent, or Firm—Troxell Law Office PLLC

(57) ABSTRACT

Convenient portable memory device including a cartridge member including a chamber and a cap member. The chamber is defined by a rigid wall for accommodating a memory unit. The chamber has an opening communicating with outer side of the cartridge member, whereby a USB plug or interface of the memory unit can extend through the opening out of the chamber. The cap member is detachably fitted with the chamber to close the opening thereof. The cap member defines an internal space for accommodating the USB plug or interface of the memory unit. The memory device further includes an accessory at least one end of which is restricted on the cap member. The accessory has a clip plate extending on outer side of the cartridge in a direction to the chamber to form a clip plate. The cartridge member serves to protect the memory unit and the plug thereof.

9 Claims, 6 Drawing Sheets

PEN-TYPE PORTABLE MEMORY DEVICE

BACKGROUND OF THE INVENTION

The present invention is related to a housing structure of a memory device, and more particularly to a pen-type memory device which can be conveniently carried.

Many patterns of notebook-type computers have been developed and widely used. Such notebook-type computers have light weight and small volume and thus can be conveniently carried and operated. Taiwanese Patent No. 88202554 discloses a drawable hard disc module of portable computer. One side of the computer main frame is equipped with a CD-ROM socket in which the drawable hard disc module can be inserted for the computer mainframe to read.

However, such drawable hard disc module still has considerably large volume. An improved memory device has been developed, which has even lighter weight and smaller volume. Via a projecting USB plug, the memory device can be easily electrically connected with the computer main frame. In addition, the memory device has greater memory capacity. However, a problem derived from such memory device is that when carried, such memory device is generally placed in a pocket of a user's clothes or a suitcase. When the user crouches or sits down, the projecting USB plug is often deformed or broken. As a result, it will be impossible to plug the USB plug into the computer main frame.

A hard plastic case has been developed for enclosing the memory device and protecting the memory device and the USB plug thereof from being damaged during carriage. However, such protective case enlarges the space occupied by the memory device in the pocket or the suitcase. Moreover, when it is desired to plug the USB plug into the computer main frame, the user must first open the protective case and then take out the memory device to connect with the computer main frame. Such procedure is quite troublesome.

SUMMARY OF THE INVENTION

It is therefore a primary object of the present invention to provide a convenient portable memory device in which the memory unit and the USB plug thereof are well protected from being deformed or damaged. Moreover, the USB plug can be still conveniently plugged into the computer main frame. With the protection, the memory device still only has a volume almost equal to the original volume of the memory device. Therefore, the memory device can be easily carried and used.

According to the above object, the above memory device includes a cartridge member having a chamber and a cap member. The chamber is defined by a rigid wall for accommodating a memory unit. The chamber has an opening communicating with outer side of the cartridge member. A USB plug or interface of the memory unit can extend through the opening out of the chamber. The cap member is detachably fitted with the chamber to close the opening thereof. The cap member defines an internal space for accommodating the USB plug or interface of the memory unit. The cap member has a top plane and a dome connected on the top plane. The memory device further includes an accessory at least one end of which is restricted or fixed on the cap member. The accessory further has a clip plate extending on outer side of the cartridge in a direction to the chamber. By means of the clip plate clipping an edge of a pocket of a user's clothes, the memory device can be easily carried.

When assembling the cap member with the chamber in a closed state, a flange of a rib of inner face of the cap member is engaged in a groove or a slit formed on outer face of the chamber to keep the cap member in the closed state. However, a user can easily forcedly disengage the cap member from the chamber, permitting the USB plug to be directly plugged into the computer main frame.

The present invention can be best understood through the following description and accompanying drawings wherein:

DETAILED DESCRIPTION OF THE PREFERRED EMBODIMENTS

Figure 1:
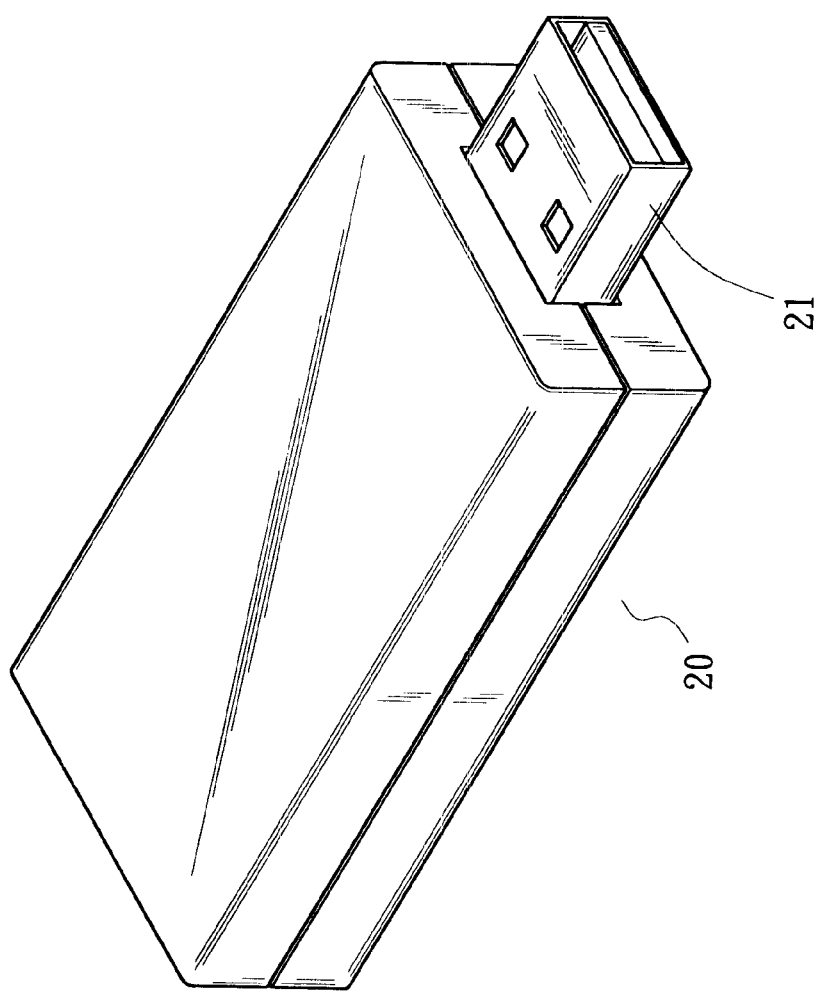
FIG. 1 is a perspective view of a conventional memory unit.
Figure 2:
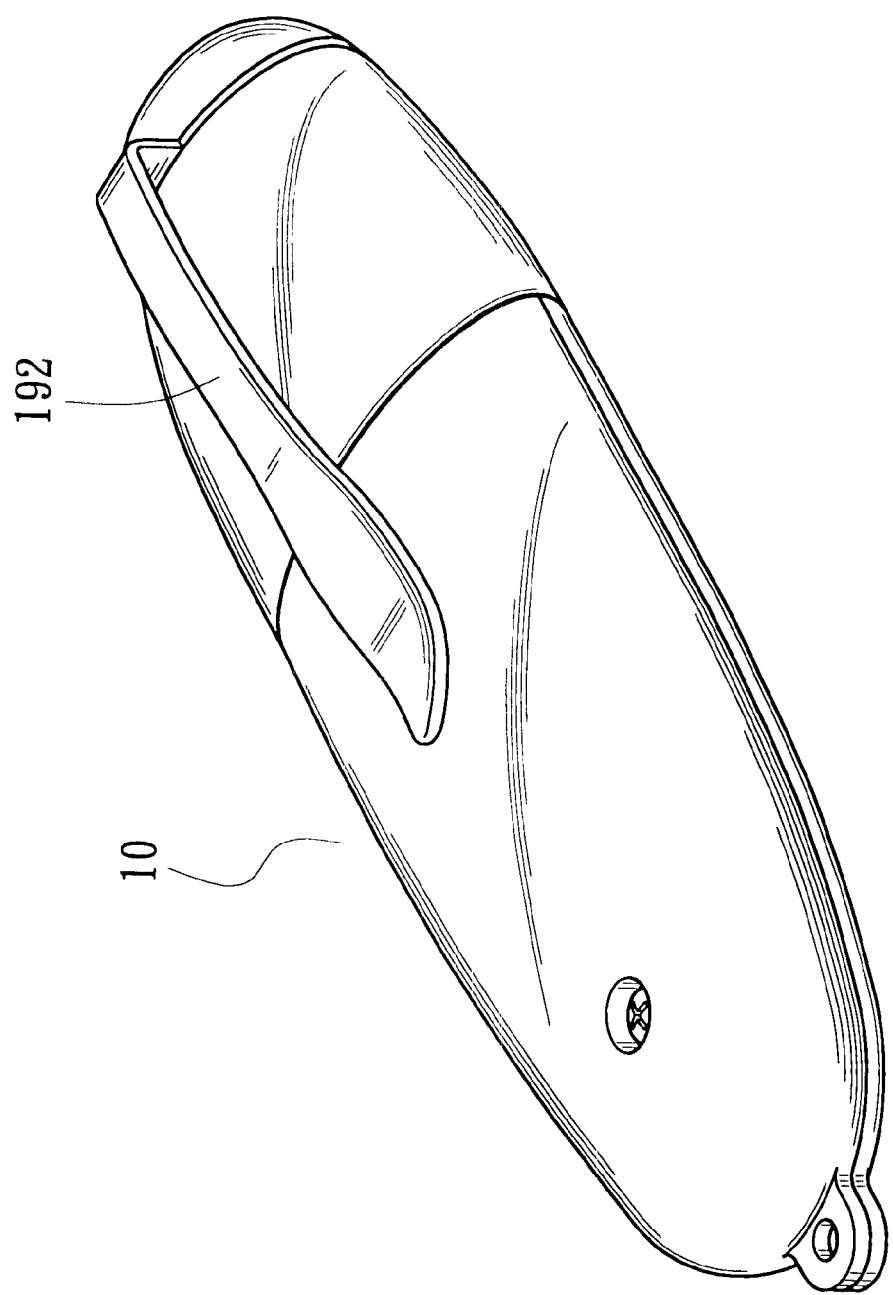
FIG. 2 is a perspective view of the memory unit of the present invention.
Figure 3:
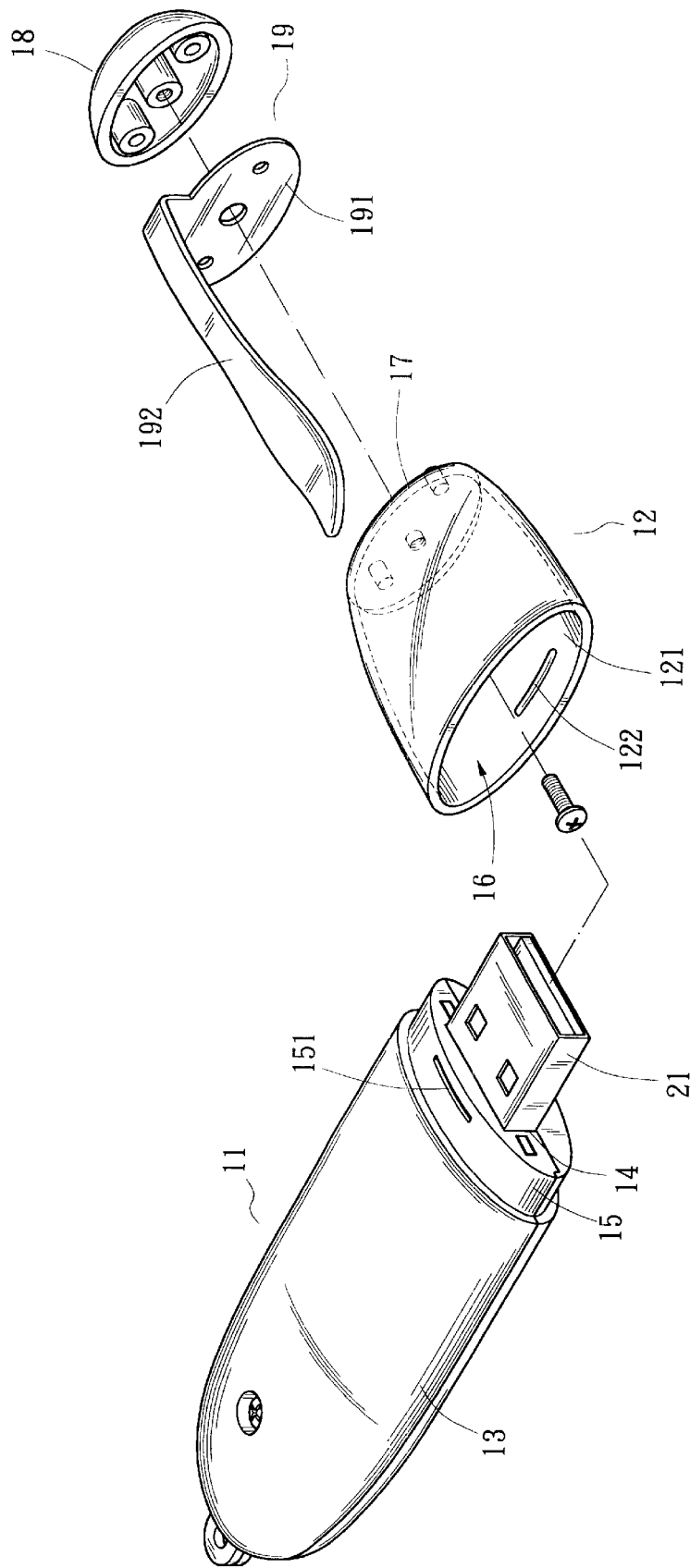
FIG. 3 is a perspective exploded view of the present invention.
Figure 4:
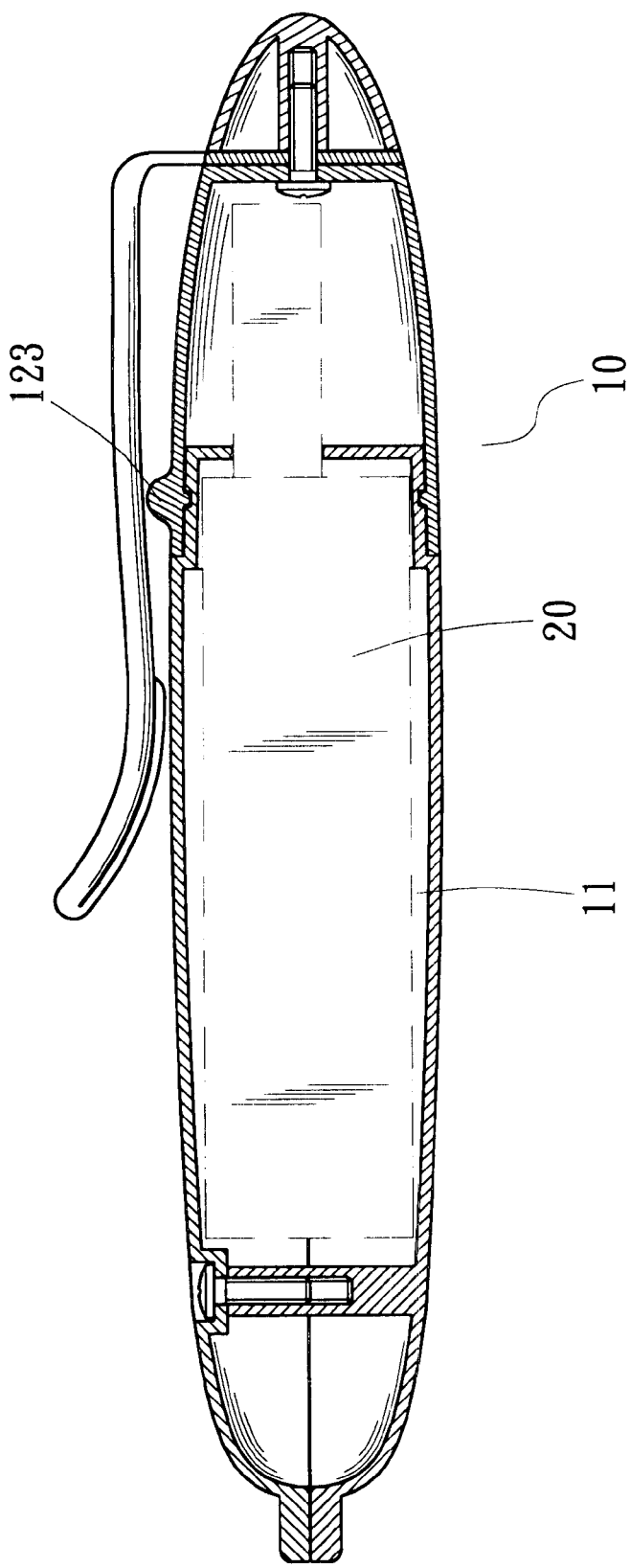
FIG. 4 is a sectional view according to FIG. 2, in which the phantom line shows the memory unit accommodated in the cartridge of the present invention.

Please refer to FIGS. 2 and 3. The convenient portable memory device of the present invention includes a cartridge member 10 having a chamber 11 (as shown in FIG. 4) and a cap member 12 detachably fitted with the chamber 11. The chamber 11 is defined by a rigid wall 13 for receiving therein a memory unit 20 as shown in FIG. 1. The chamber 11 has an opening 14 communicating with outer side of the cartridge 10. The USB plug or interface 21 of the memory unit 20 can extend through the opening 14 out of the chamber 11 for electrically connecting with a computer main frame.

In a preferred embodiment, the capacity of the chamber 11 is equal to the volume of the memory unit 20. The chamber 11 has a shoulder section 15 which is formed at one end of the rigid wall 13 for fitting with the cap member 12. The outer face of the shoulder section 15 is formed with at least one groove or slit 151.

The rigid wall of the cap member 12 defines an internal space 16 for accommodating the USB plug 21 of the memory unit 20 and the shoulder section 15 of the chamber as shown in FIG. 4. The inner face of the cap member 12 is formed with a flange or rib 122 corresponding to the slit 151. When assembling the cap member 12 with the chamber 11, the rib 122 is engaged in the slit 151 to prevent the cap member 12 from detaching from the chamber 11. The cap member 12 includes a top plane 17 and a dome 18 connected on the top plane 17. Preferably, the dome 18 is locked on the plane 17. A disc 191 of an accessory 19 is fixed between the plane 17 and the dome 18. The accessory 19 further includes a clip plate 192 perpendicularly projecting from the edge of the disc 191. The clip plate 192 extends in a direction to the chamber 11 in parallel to outer side of the cartridge 10. The clip plate 192 at least partially almost contacts with the rigid wall 13 as shown in FIG. 4 for providing a clipping effect.

Figure 5:
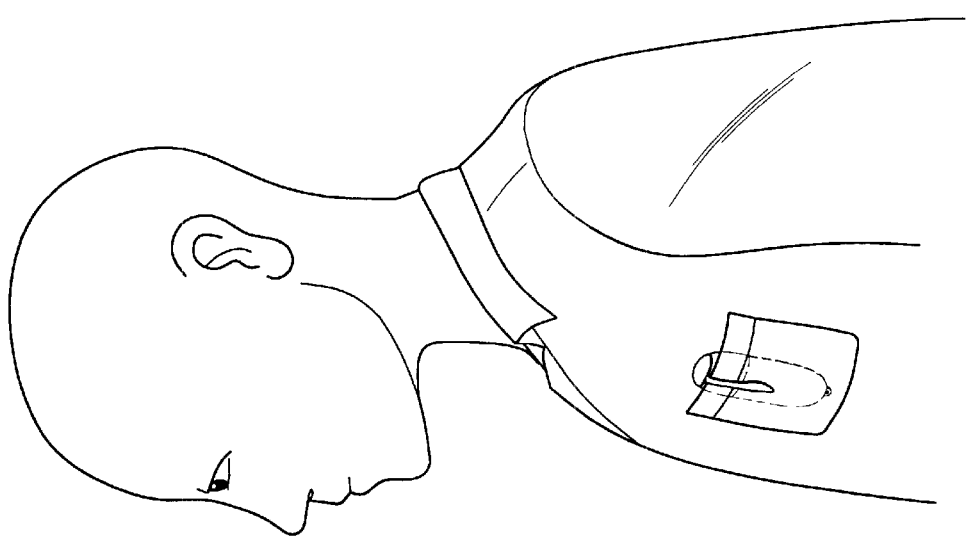
FIG. 5 shows that a user carries the memory unit of the present invention.

Referring to FIGS. 4 and 5, the cap member 12 is fitted on the shoulder section 15 to form the cartridge which can be received in a pocket with the accessory 19 clipping the edge thereof.

Figure 6:
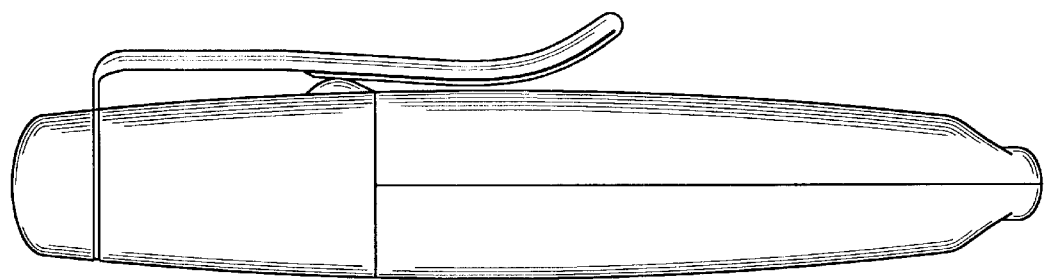
FIG. 6 shows another embodiment of the cap member of the present invention.

FIG. 6 shows another embodiment of the present invention, in which the outer face of the rigid wall is formed with a key 123 behind the clip plate 192 for enhancing the clipping effect. In another embodiment, the outer wall of the memory unit 20 is directly pressed and formed into the configuration of the chamber 11 of the cartridge 10.

The USB plug or interface 21 of the memory unit 20 can extend through the opening 14 out of the chamber 11. The cap member 12 serves to enclose the USB plug or interface 21. According to the above structure, the present invention has the following advantages:

1. The USB plug or interface 21 of the memory unit 20 is well protected from being deformed or damaged.
2. The cartridge is equipped with a clip plate for easily hanging or carrying the memory unit.
3. When assembling the cap member 12 with the chamber 11 in a closed state, the rib 122 of inner face 121 of the cap member 12 is engaged in the slit 151 of the shoulder section 15 to keep the cap member 12 in the closed state. However, a user can easily forcedly disengage the cap member 12 from the chamber 11, permitting the USB plug or interface 21 to be directly plugged into the computer main frame.
4. The cap member 12 has at least one internal space 16 with a capacity for only sufficiently accommodating the USB plug or interface 21. Accordingly, the memory unit can be easily carried without damaging the USB plug or interface 21.
5. The chamber 11 has a capacity for only sufficiently accommodating the memory unit 20. Alternatively, the outer wall of the memory unit 20 is directly formed into the configuration of the chamber 11.

The above embodiments are only used to illustrate the present invention, not intended to limit the scope thereof. Many modifications of the above embodiments can be made without departing from the spirit of the present invention.

What is claimed is:

1. Pen-type portable memory device comprising a cartridge member including a chamber and a cap member, the chamber being defined by a rigid wall for accommodating a memory unit, the chamber having an opening communicating with outer side of the cartridge member, whereby a USB plug or interface of the memory unit can extend through the opening out of the chamber, the cap member being detachably fitted with the chamber to close the opening thereof, the cap member defining an internal space for accommodating the USB plug or interface of the memory unit, the memory device further comprising an accessory at least one end of which is restricted or fixed on the cap member, the other end of the accessory extending on outer side of the cartridge in a direction to the chamber to form a clip plate.

2. Memory device as claimed in claim 1, wherein the cap member has a top plane and a dome connected on the top plane.

3. Memory device as claimed in claim 1, wherein one end of the accessory is a disc fixed between the top plane and the dome, the accessory further including a clip plate perpendicularly projecting from an edge of the disc.

4. Memory device as claimed in claim 1, wherein the chamber has a shoulder section which extends from one end of the rigid wall, an outer face of the shoulder section being formed with at least one groove and slit.

5. Memory device as claimed in claim 1, wherein the inner face of the cap member is formed with a flange or rib corresponding to the groove or slit, whereby when assembling the cap member with the chamber, the flange or rib is engaged in the groove or slit to prevent the cap member from detaching from the chamber.

6. Memory device as claimed in claim 1, wherein the outer face of the rigid wall of the cap member is formed with a key behind the clip plate of the accessory.

7. Memory device as claimed in claim 1, wherein outer wall of the memory unit is directly pressed and formed into the configuration of the chamber of the cartridge.

8. Memory device as claimed in claim 2, wherein one end of the accessory is a disc fixed between the top plane and the dome, the accessory further including a clip plate perpendicularly projecting from an edge of the disc.

9. Memory device as claimed in claim 4, wherein the inner face of the cap member is formed with a flange or rib corresponding to the groove or slit, whereby when assembling the cap member with the chamber, the flange or rib is engaged in the groove or slit to prevent the cap member from detaching from the chamber.

* * * * *